(12) United States Patent
Hsieh

(10) Patent No.: US 7,015,513 B2
(45) Date of Patent: Mar. 21, 2006

(54) ORGANIC ADHESIVE LIGHT-EMITTING DEVICE WITH A VERTICAL STRUCTURE

(75) Inventor: Min-Hsun Hsieh, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 10/905,466

(22) Filed: Jan. 5, 2005

(65) Prior Publication Data

US 2005/0184297 A1 Aug. 25, 2005

(30) Foreign Application Priority Data

Feb. 20, 2004 (TW) ............................... 93104392 A

(51) Int. Cl.
*H01L 29/22* (2006.01)
(52) U.S. Cl. ........................................ 257/99; 257/642
(58) Field of Classification Search ................. 257/40, 257/99, 98, 100, 642, 643
See application file for complete search history.

(56) References Cited

U.S. PATENT DOCUMENTS

| | | | | |
|---|---|---|---|---|
| 6,630,684 B1 * | 10/2003 | Lee et al. | ...................... | 257/40 |
| 6,900,476 B1 * | 5/2005 | Steubel et al. | ................ | 257/99 |
| 2004/0106225 A1 | 6/2004 | Hsieh et al. | | |
| 2005/0167659 A1 * | 8/2005 | Hsieh et al. | .................. | 257/40 |

* cited by examiner

*Primary Examiner*—Sara Crane
(74) *Attorney, Agent, or Firm*—Winston Hsu

(57) ABSTRACT

An organic adhesive light-emitting device with a vertical structure is provided. The organic adhesive light-emitting device comprises a conductive substrate with a concavo-convex upper surface; a first metal layer formed on the concavo-convex upper surface of the conductive substrate; an organic adhesive material formed over the first metal layer; a second metal layer formed over the organic adhesive material, wherein all or part of the first metal layer over the concavo-convex upper surface is in ohmic contact with the second metal layer through the organic adhesive material; a reflective layer formed over the second metal layer; and a light-emitting stack layer formed over the second metal layer. The process for manufacturing the present invention organic adhesive light-emitting device is less complex than that for manufacturing prior art diodes.

26 Claims, 2 Drawing Sheets

ORGANIC ADHESIVE LIGHT-EMITTING DEVICE WITH A VERTICAL STRUCTURE

BACKGROUND OF INVENTION

1. Field of the Invention

The present invention relates to a light emitting diode, and more particularly, to a light emitting diode with a vertical structure.

2. Description of the Prior Art

The applications of light-emitting diodes are extensive and include optical display devices, traffic signals, data storing devices, communication devices, illumination devices, and medical apparatuses. As such, it is important to increase the brightness of light-emitting diodes, and to simplify manufacturing processes in order to decrease the cost of the light-emitting diode.

A light-emitting diode and its related manufacture method are disclosed in U.S. Pub. No. 2004-0106225, in which a light-emitting diode stack layer is stuck to a transparent substrate by means of a transparent adhesive layer, causing light emitted toward the transparent substrate not to be absorbed, and improving the brightness of the diode. Nevertheless, the prior art method, due to the non-conductivity of the transparent adhesive layer, while being suitable for use in diodes of which two electrodes are located at the same side, is not suitable for use in diodes of which electrodes are respectively located at the upper surface and bottom surface of the diode. In addition, part of the diode stack layer needs to be removed by means of an etching process to produce two electrodes at the same side. In doing so, not only is material wasted, but also the complexity of the processes is increased.

SUMMARY OF INVENTION

It is therefore an object of the claimed invention to develop a light emitting diode with a vertical structure, of which a light-emitting stack layer and a conductive substrate are in ohmic contact for conductivity, to simplify manufacturing processes and to reduce the cost of the diode.

Briefly described, the claimed invention discloses an organic adhesive light-emitting device with a vertical structure. The organic adhesive light-emitting device comprises a conductive substrate with a scraggy upper surface; a first metal layer formed on the scraggy upper surface of the conductive substrate; an organic adhesive material formed over the first metal layer; a second metal layer formed over the organic adhesive material, wherein part or entire of the first metal layer over the scraggy upper surface through the organic adhesive material is in ohmic contact with the second metal layer; a reflective layer formed over the second metal layer; and a light-emitting stack layer formed over the second metal layer. Furthermore, using the first metal layer and the second layer causes strengthen of adhesion.

According to the claimed invention, the conductive substrate comprises at least one material from a material group consisting of GaP, GaAsP, AlGaAs, Si, SiC, Ge, Cu, Al, Mo, metal matrix composite (MMC) carrier, or other substitute materials, where the MCC carrier indicates that a carrier with a hole filled with metal matrix has an adjustable heat-transfer coefficient or a adjustable thermal expansion coefficient. The adhesive material comprises at least one material selected from a material group consisting of polyimide (PI), benzocyclobutane (BCB), and perfluorocyclobutane (PFCB). The reflective layer comprises at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide. Both the first metal layer and the second metal layer comprise at least one material selected from a material group consisting of Ti and Cr. The light-emitting stack layer comprises at least one material selected from a material group consisting of AlInGaP, GaN, InGaN, and AlInGaN.

These and other objects of the claimed invention will no doubt become obvious to those of ordinary skill in the art after reading the following detailed description of the preferred embodiment that is illustrated in the various figures and drawings.

DETAILED DESCRIPTION

Figure 1:
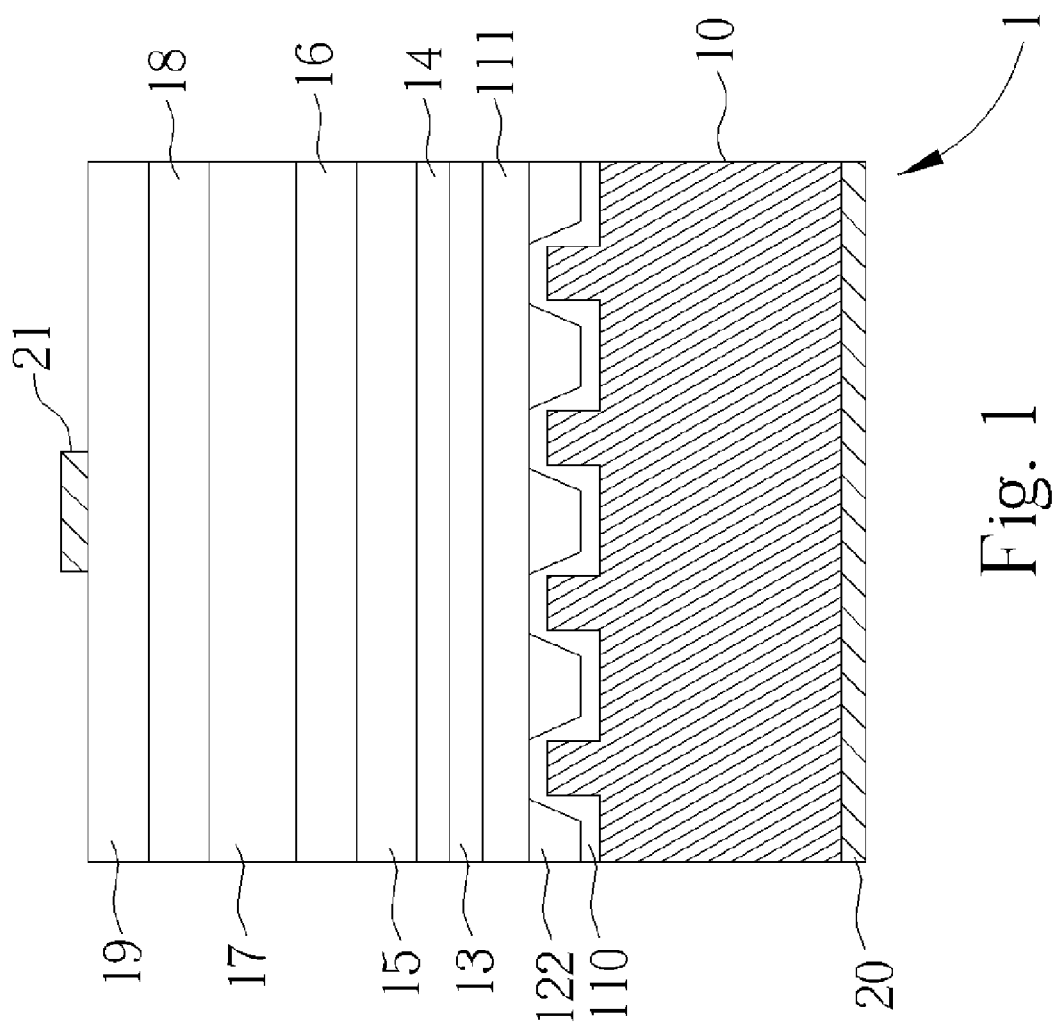
FIG. 1 shows a first embodiment of the organic adhesive light-emitting device with a vertical structure according to the present invention.

Please refer to FIG. 1, which is a first embodiment of the organic adhesive light-emitting device 1 with a vertical structure according to the present invention. The organic adhesive light-emitting device 1 comprises a first electrode 20, a conductive substrate 10 with a concavo-convex upper surface formed over the first electrode 20, a first metal layer 110 formed over the concavo-convex upper surface of the conductive substrate 10, an organic adhesive material 122 formed over the first metal layer 110, a second metal layer 111 formed over the organic adhesive material 122, in which all or part of the first metal layer 110 is in ohmic contact with the second metal layer 111 through the organic adhesive material 122 after being subject to a press process. The organic adhesive light-emitting device 1 also comprises a reflective layer 13 formed over the second metal layer 111, a transparent conductive layer 14 formed over the reflective layer 13, a first contact layer 15 formed over the transparent conductive layer 14, a first binding layer 16 formed over the first contact layer 15, a light-emitting layer 17 formed over the first binding layer 16, a second binding layer 18 formed over the light-emitting layer 17, a second contact layer 19 formed over the second binding layer 18, and a second electrode 21 formed over the second contact layer 19. The first and the second metal layers are used to the strengthen adhesion to the adhesive material. Etching the conductive substrate to form a concavo-convex upper surface with a predetermined pattern, or an irregular roughing surface is needed. The reflective layer 11 3 used to enhance the brightness is not necessary for implementing the present invention, and can be removed.

Figure 2:
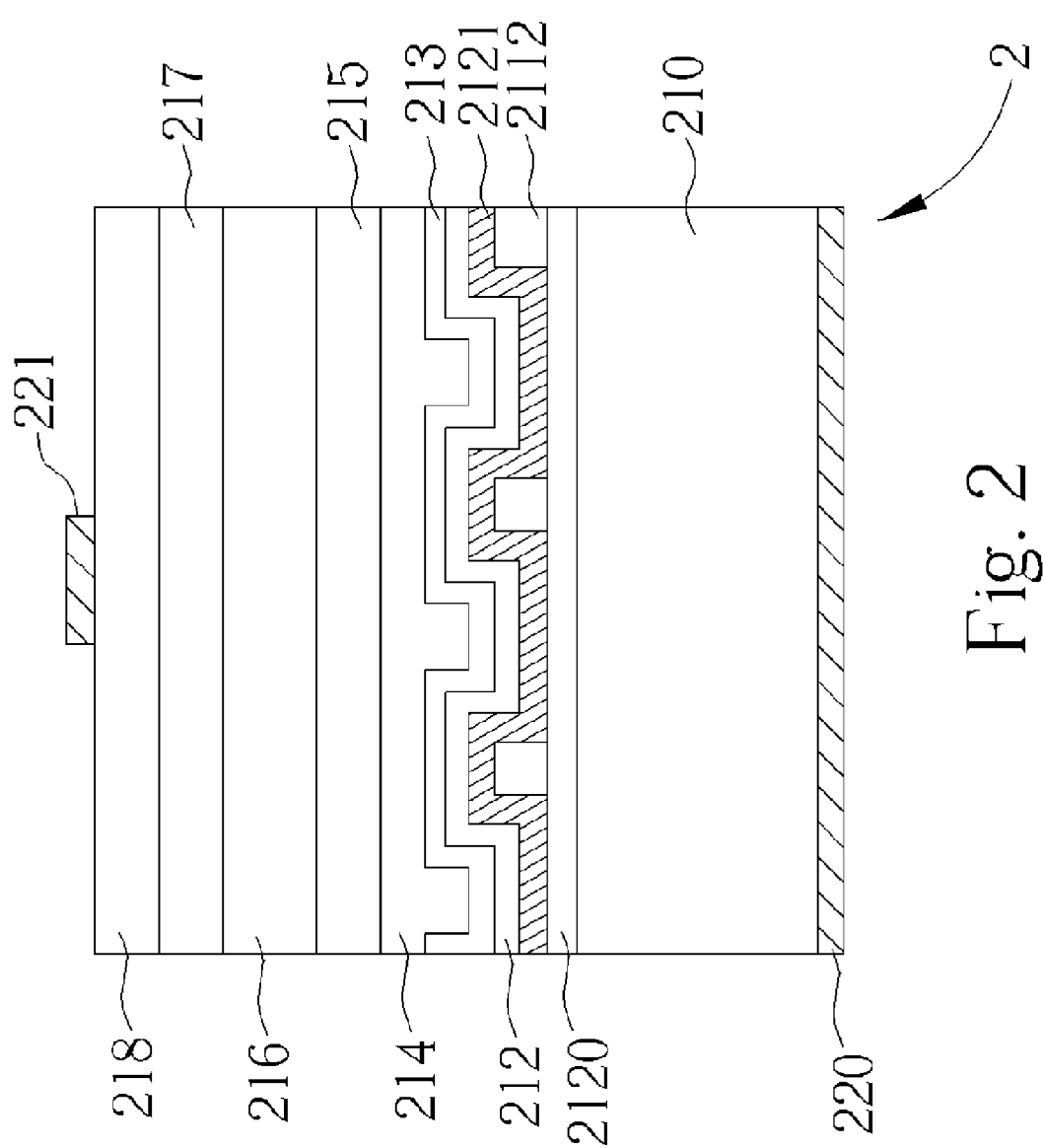
FIG. 2 shows a second embodiment of the organic adhesive light-emitting device with a vertical structure according to the present invention.

Please refer to FIG. 2, which is a second embodiment of the organic adhesive light-emitting device 2 with a vertical structure according to the present invention. The organic adhesive light-emitting device 2 comprises a first electrode 220, a conductive substrate 210 formed over the first electrode 220, a first metal layer 2120 formed over the conductive substrate 210, an organic adhesive material 2112 formed over the first metal layer 2120, a second metal layer 2121 with a concavo-convex surface formed over the organic adhesive material 2112, a reflective layer 212 formed over the second metal layer 2121, a transparent conductive layer 213 formed over the reflective layer 212, a first contact layer 214 with a concavo-convex bottom surface formed over the transparent conductive layer 213. The transparent conductive layer adjacent to the concavo-convex bottom surface, the reflective layer adjacent to the transparent conductive layer, and the second metal layer adjacent to the reflective layer have concavo-convex surfaces by using a pressing process. Furthermore, all or part of the second metal layer 2121 is in ohmic contact with the first metal layer 2120 through the organic adhesive material 2112. The organic adhesive light-emitting device 2 also comprises a first binding layer 215 formed over the first contact layer, a light-emitting layer 216 formed over the first binding layer 215, a second binding layer 217 formed over the light-emitting layer 216, a second contact layer 218 formed over the second binding layer 217, and a second electrode 221 formed over the second contact layer 218. The first and the second metal layers are used to strengthen adhesion to the adhesive material. Etching of the first contact layer to form a concavo-convex bottom surface with a predetermined pattern or with an irregular roughing surface is needed. The reflective layer 212 used to enhance the brightness is not necessary for implementing the present invention, and can be removed.

The conductive substrate comprises at least one material from a material group consisting of GaP, GaAsP, AlGaAs, Si, SiC, Ge, Cu, Al, Mo, metal matrix composite (MMC) carrier, or other substitute materials, where the term MCC carrier indicates a carrier with a hole filled with metal matrix and having an adjustable heat-transfer coefficient or an adjustable thermal expansion coefficient. The adhesive material comprises at least one material selected from a material group consisting of polyimide (PI), benzocyclobutane (BCB), and perfluorocyclobutane (PFCB). The reflective layer comprises at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide. Both the first metal layer and the second metal layer comprise at least one material selected from a material group consisting of Ti and Cr. Both the first binding layer and the second binding layer comprise at least one material selected from a material group consisting of AlInGaP, AlInP, AlN, GaN, AlGaN, InGaN, and AlInGaN. The light-emitting stack layer comprises at least one material selected from a material group consisting of AlInGaP, GaN, InGaN, and AlInGaN. Both the first contact layer and the second layer comprise at least one material selected from a material group consisting of GaP, GaAs, GaAsP, InGaP, AlInGaP, AlGaAs, GaN, InGaN, and AlGaN.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An organic adhesive light-emitting device with a vertical structure comprising:
   a first semiconductor stack layer having a concavo-convex upper surface;
   a first metal layer formed on the concavo-convex upper surface of the first semiconductor stack layer;
   an organic adhesive material formed over the first metal layer; and
   a second semiconductor stack layer formed over the organic adhesive material, wherein with the existence of the concave-convex upper surface, all or part of the first metal layer over the concave-convex upper surface is in ohmic contact with the second semiconductor stack layer through the organic adhesive material.

2. The organic adhesive light-emitting device with a vertical structure of claim 1, wherein the first semiconductor stack layer is a conductive substrate.

3. The organic adhesive light-emitting device with a vertical structure of claim 1, wherein the second semiconductor stack layer comprises:
   a first conductive semiconductor stack layer;
   a light-emitting layer formed over the first conductive semiconductor stack layer; and
   a second conductive semiconductor stack layer formed over the light-emitting layer.

4. The organic adhesive light-emitting device with a vertical structure of claim 1, wherein the second semiconductor stack layer is a conductive substrate.

5. The organic adhesive light-emitting device with a vertical structure of claim 1, wherein the first semiconductor stack layer comprises:
   a first conductive semiconductor stack layer;
   a light-emitting layer formed over the first conductive semiconductor stack layer; and
   a second conductive semiconductor stack layer formed over the light-emitting layer.

6. The organic adhesive light-emitting device with a vertical structure of claim 1 further comprising a reflective layer formed between the organic adhesive material and the second semiconductor stack layer.

7. The organic adhesive light-emitting device with a vertical structure of claim 1 further comprising a reflective layer formed between the first metal layer and the first semiconductor stack layer.

8. The organic adhesive light-emitting device with a vertical structure of claim 1, wherein the concavo-convex upper surface is an irregular roughing surface.

9. The organic adhesive light-emitting device with a vertical structure of claim 1, wherein the first semiconductor stack layer is in ohmic contact with the first metal layer.

10. The organic adhesive light-emitting device with a vertical structure of claim 6 further comprising a second metal layer formed between the organic adhesive material and the reflective layer.

11. The organic adhesive light-emitting device with a vertical structure of claim 2, wherein the conductive layer comprises at least one material from a material group consisting of GaP, GaAsP, AlGaAs, Si, SiC, Ge, Cu, Al, Mo, metal matrix composite carrier.

12. The organic adhesive light-emitting device with a vertical structure of claim 1, wherein the concavo-convex upper surface is a uniform-distributed etching surface.

13. The organic adhesive light-emitting device with a vertical structure of claim 1, wherein the organic adhesive material comprises at least one material selected from a material group consisting of polyimide (PIT), benzocyclobutane (BCB), and perfluorocyclobutane (PFCB).

14. The organic adhesive light-emitting device with a vertical structure of claim 1, wherein the first metal layer comprises at least one material selected from a material group consisting of Ti and Cr.

15. The organic adhesive light-emitting device with a vertical structure of claim 1, wherein the second metal layer comprises at least one material selected from a material group consisting of Ti and Cr.

16. The organic adhesive light-emitting device with a vertical structure of claim 6, wherein the reflective layer comprises at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide.

17. The organic adhesive light-emitting device with a vertical structure of claim 2 further comprising a second metal layer formed between the organic adhesive material and the second semiconductor stack layer wherein all or part of the first metal layer over the concavo-convex upper surface is incapable of ohmic contact with the second metal layer through the organic adhesive material.

18. The organic adhesive light-emitting device with a vertical structure of claim 5 further comprising a second metal layer formed between the organic adhesive material and the first semiconductor stack layer, wherein all or part of the second metal layer over the concavo-convex upper surface is incapable ohmic contact with the first metal layer through the organic adhesive material.

19. The organic adhesive light-emitting device with a vertical structure of claim 17, wherein the second metal layer comprises at least one material selected from a material group consisting of Ti and Cr.

20. The organic adhesive light-emitting device with a vertical structure of claim 18, wherein the second metal layer comprises at least one material selected from a material group consisting of Ti and Cr.

21. The organic adhesive light-emitting device with a vertical structure of claim 6 further comprising a transparent conductive layer formed between the reflective layer and the second semiconductor stack layer.

22. The organic adhesive light-emitting device with a vertical structure of claim 7 further comprising a transparent conductive layer formed between the reflective layer and the first semiconductor stack layer.

23. The organic adhesive light-emitting device with a vertical structure of claim 3, wherein the light-emitting stack layer comprises at least one material selected from a material group consisting of AlInGaP. GaN, InGaN, and AlInGaN.

24. The organic adhesive light-emitting device with a vertical structure of claim 5, wherein the light-emitting stack layer comprises at least one material selected from a material group consisting of AlInGaP, GaN, InGaN, and AlInGaN.

25. The organic adhesive light-emitting device with a vertical structure of claim 21, wherein the transparent conductive layer comprises at least one material selected from a material group consisting of indium tin oxide, cadmium tin oxide, antimony tin oxide, zinc oxide, and zinc tin oxide, Be/Au, Ge/Au, and Ni/Au.

26. The organic adhesive light-emitting device with a vertical structure of claim 22, wherein the transparent conductive layer comprises at least one material selected from a material group consisting of indium tin oxide, cadmium tin oxide, antimony tin oxide, zinc oxide, and zinc tin oxide, Be/Au, Ge/Au, and Ni/Au.

* * * * *